(12) United States Patent
Adamec (10) Patent No.: US 11,469,072 B2
(45) Date of Patent: Oct. 11, 2022

(54) CHARGED PARTICLE BEAM APPARATUS, SCANNING ELECTRON MICROSCOPE, AND METHOD OF OPERATING A CHARGED PARTICLE BEAM APPARATUS

(71) Applicant: ICT Integrated Circuit Testing Gesellschaft für Halbleiterprüftechnik mbH, Heimstetten (DE)

(72) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 17/177,926

(22) Filed: Feb. 17, 2021

(65) Prior Publication Data
US 2022/0262592 A1    Aug. 18, 2022

(51) Int. Cl.
*H01J 37/065* (2006.01)
*H01J 37/21* (2006.01)
*H01J 37/147* (2006.01)
*H01J 37/28* (2006.01)

(52) U.S. Cl.
CPC ........ *H01J 37/065* (2013.01); *H01J 37/1474* (2013.01); *H01J 37/21* (2013.01); *H01J 37/28* (2013.01)

(58) Field of Classification Search
CPC .......... H01J 37/00; H01J 37/02; H01J 37/065; H01J 37/21; H01J 37/28; H01J 37/1474; H01J 37/09; H01J 37/147; H01J 37/18; H01J 37/226; H01J 37/26; H01J 37/261
USPC .......................................... 250/306, 307, 311
See application file for complete search history.

(56) References Cited

U.S. PATENT DOCUMENTS

| | | | |
|---|---|---|---|
| 2,899,556 A | 8/1959 | Schopper et al. | |
| 5,828,064 A | 10/1998 | Knowles | |
| 8,513,619 B1 | 8/2013 | Nasser-Ghodsi et al. | |
| 2014/0077077 A1* | 3/2014 | Jiang | H01J 37/09 315/111.81 |

(Continued)

OTHER PUBLICATIONS

International Search Report and Written Opinion for Application No. PCT/EP2022/050900, dated May 12, 2022, 14 pages.

*Primary Examiner* — Jason L McCormack
(74) *Attorney, Agent, or Firm* — Kilpatrick Townsend & Stockton LLP (57) ABSTRACT

A charged particle beam apparatus (100) is described. The charged particle beam apparatus includes a first vacuum region (121) in which a charged particle beam emitter (105) for emitting a charged particle beam (102) along an optical axis (A) is arranged, a second vacuum region (122) downstream of the first vacuum region and separated from the first vacuum region by a first gas separation wall (132) with a first differential pumping aperture (131), wherein the first differential pumping aperture (131) is configured as a first beam limiting aperture for the charged particle beam (102); and a third vacuum region (123) downstream of the second vacuum region and separated from the second vacuum region by a second gas separation wall (134) with a second differential pumping aperture (133), wherein the second differential pumping aperture (133) is configured as a second beam limiting aperture for the charged particle beam (102). Further described are a scanning electron microscope and a method of operating a charged particle beam apparatus.

20 Claims, 4 Drawing Sheets

(56) References Cited

U.S. PATENT DOCUMENTS

2016/0240345 A1\* 8/2016 Frosien ................. H01J 37/065
2018/0226221 A1\* 8/2018 Danilatos ................ H01J 37/20

\* cited by examiner

CHARGED PARTICLE BEAM APPARATUS, SCANNING ELECTRON MICROSCOPE, AND METHOD OF OPERATING A CHARGED PARTICLE BEAM APPARATUS

TECHNICAL FIELD

Embodiments described herein relate to a charged particle beam apparatus, particularly to an electron beam apparatus, for inspection or imaging system applications, testing system applications, lithography system applications, electron microscopes or the like. Specifically, a charged particle beam apparatus configured for providing a charged particle beam that is usable for different applications is described. Embodiments described herein also relate to methods of operating a charged particle beam apparatus, to a gun housing arrangement for providing an electron beam and to a scanning electron microscope.

BACKGROUND

Charged particle beam apparatuses have many functions in a plurality of industrial fields including, but not limited to, critical dimensioning, defect review, inspection of semiconductor substrates, wafers and other specimens, exposure systems for lithography, detector arrangements, imaging systems and testing systems. Thus, there is a high demand for structuring, testing and inspecting specimens on the micrometer and nanometer scale.

Micrometer and nanometer scale process control, inspection or structuring is often done with charged particle beams, e.g., electron beams, which are generated and focused in charged particle beam apparatuses, such as electron microscopes. Charged particle beams offer superior spatial resolution compared to, e.g., photon beams, enabling high-resolution imaging and inspection.

Generally, charged particle beam apparatuses are operated under vacuum conditions, specifically under ultra-high vacuum conditions. In particular, the charged particle beam emitter is typically arranged in an evacuated gun housing under ultra-high vacuum conditions. Still, unwanted ions, ionized molecules or other contamination particles can be present in the evacuated gun housing. If the contamination particles have a charge that is opposite to the charge of the charged particles emitted by the emitter, the particles are accelerated toward the emitter. As a result, the emitter can be mechanically deformed or can be otherwise negatively affected, e.g. by the accumulation of particles on an emitter surface, which can introduce noise and other beam instabilities.

Specifically, contamination particles in the region of the charged particle beam emitter may lead to an unstable or noisy charged particle beam, e.g. to a varying beam current or a variable beam profile. Therefore, the vacuum conditions within a charged particle beam apparatus, and specifically within the gun housing that houses the charged particle beam emitter, are critical.

In view of the above, it would be beneficial to improve the beam stability of charged particle beams in charged particle beam apparatuses and to reduce the amount of contamination particles within the gun housing. Specifically, it would be beneficial to provide a compact charged particle beam apparatus and a scanning electron microscope that emit a charged particle beam with an improved stability. Further, it would be beneficial to provide a method of operating a charged particle beam apparatus such as to provide a charged particle beam with an improved beam stability.

SUMMARY

In light of the above, a charged particle beam apparatus, a scanning electron microscope, and a method of operating a charged particle beam apparatus according to the independent claims are provided. Further aspects, advantages, and features are apparent from the dependent claims, the description, and the accompanying drawings.

According to one aspect, a charged particle beam apparatus is provided. The charged particle beam apparatus includes a first vacuum region in which a charged particle beam emitter for emitting a charged particle beam along an optical axis is arranged; a second vacuum region downstream of the first vacuum region and separated from the first vacuum region by a first gas separation wall with a first differential pumping aperture, wherein the first differential pumping aperture is configured as a first beam limiting aperture for the charged particle beam; and a third vacuum region downstream of the second vacuum region and separated from the second vacuum region by a second gas separation wall with a second differential pumping aperture, wherein the second differential pumping aperture is configured as a second beam limiting aperture for the charged particle beam.

In some embodiments, the first vacuum region, the second vacuum region, and the third vacuum region are enclosed by a gun housing that is attached to or attachable to a column housing which includes at least a fourth vacuum region.

According to another aspect, a scanning electron microscope for inspecting a specimen is provided. The scanning electron microscope includes a first vacuum region in which a cold field emitter for emitting an electron beam along an optical axis is arranged; a second vacuum region downstream of the first vacuum region and separated from the first vacuum region by a first gas separation wall with a first differential pumping aperture, wherein the first differential pumping aperture is configured as a first beam limiting aperture for the electron beam; a third vacuum region downstream of the second vacuum region and separated from the second vacuum region by a second gas separation wall with a second differential pumping aperture, wherein the second differential pumping aperture is configured as a second beam limiting aperture for the electron beam; a lens arrangement provided in at least one of the second vacuum region and the third vacuum region; a fourth vacuum region downstream of the third vacuum region and separated from the third vacuum region by a third gas separation wall with a third differential pumping aperture for the electron beam; at least one of a scan deflector, an objective lens and a charged particle detector arranged in the fourth vacuum region; and a specimen stage for placing the specimen to be inspected thereon.

According to another aspect, a method of operating a charged particle beam apparatus is provided. The method includes evacuating a first vacuum region, a second vacuum region downstream of the first vacuum region and separated from the first vacuum region by a first gas separation wall with a first differential pumping aperture, and a third vacuum region downstream of the second vacuum region and separated from the second vacuum region by a second gas separation wall with a second differential pumping aperture; generating a charged particle beam in the first vacuum region; directing the charged particle beam through the first differential pumping aperture in the first gas separation wall, wherein an outer portion of the charged particle beam is blocked; and directing the charged particle beam through the second differential pumping aperture in the second gas separation wall, wherein an outer portion of the charged particle beam is blocked.

According to another aspect, a charged particle beam apparatus is provided, including: a first vacuum region in which a charged particle beam emitter for emitting a charged particle beam along an optical axis is arranged; a second vacuum region downstream of the first vacuum region and separated from the first vacuum region by a first gas separation wall with a first differential pumping aperture; a third vacuum region downstream of the second vacuum region and separated from the second vacuum region by a second gas separation wall with a second differential pumping aperture for the charged particle beam; and a fourth vacuum region downstream of the third vacuum region and separated from the third vacuum region by a third gas separation wall. The third gas separation wall has a third differential pumping aperture for the charged particle beam. The fourth vacuum region houses at least one of an objective lens and a charged particle detector. In this embodiment, the first differential pumping aperture is optically configured as a first beam limiting aperture for the charged particle beam and/or the second differential pumping aperture is optionally configured as a second beam limiting aperture for the charged particle beam.

Embodiments are also directed at apparatuses for carrying out the disclosed methods and include apparatus parts for performing each described method feature. The method features may be performed by way of hardware components, a computer programmed by appropriate software, by any combination of the two or in any other manner. Furthermore, embodiments are also directed at methods of manufacturing the described apparatuses, and methods of operating the described apparatuses. It includes method features for carrying out every function of the apparatus.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments, one or more examples of which are illustrated in the figures. Within the following description, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Without limiting the scope of the present application, in the following, the charged particle beam apparatus or parts thereof will exemplarily be referred to as an electron beam apparatus configured for the detection of signal electrons. The signal charged particles particularly encompass secondary electrons and/or backscattered electrons, specifically both secondary and backscattered electrons (SEs and BSEs). However, it is to be understood that embodiments described herein can be applied for apparatuses detecting other corpuscles such as secondary and/or backscattered charged particles in the form of ions in order to obtain a sample image or inspection or processing result. Accordingly, in embodiments described herein, charged particles are not limited to electrons.

Figure 1:
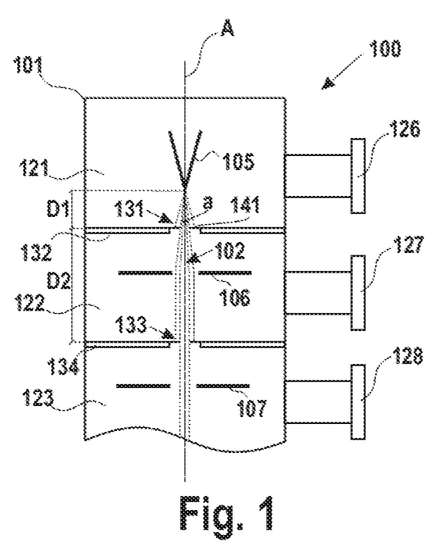
FIG. 1 is a schematic sectional view of a charged particle beam apparatus according to embodiments described herein.

FIG. 1 is a schematic sectional view of a charged particle beam apparatus 100 according to embodiments described herein. The charged particle beam apparatus 100 is configured for providing a charged particle beam 102 that can be used for, e.g., inspection or imaging applications, for example in an electron microscope.

The charged particle beam apparatus 100 includes a gun housing 101 that can be evacuated with one or more vacuum pumps, particularly to an ultra-high vacuum. A charged particle beam emitter 105, particularly an electron emitter for generating an electron beam, is arranged in the gun housing 101. The gun housing 101 with the charged particle beam emitter 105 can be placed upstream of a column of the charged particle beam apparatus (not depicted in FIG. 1). In particular, the charged particle beam 102 generated in the gun housing 101 can be focused onto a specimen with an objective lens for inspection or imaging purposes.

Charged particle beam emitters, specifically electron emitters, are very sensitive to the cleanliness of the vacuum in the gun chamber. For example, ions or other contamination particles that may accumulate on the emitter surface can impair the stability of the electron source and can lead to fluctuations of the beam current and/or beam shape. In particular, electron emitters that are based on cold field emission are extremely sensitive to the cleanliness of the vacuum.

Some charged particle beam apparatuses use several so-called differential pumping sections that are separated by a respective differential pumping aperture for improving the vacuum conditions in the gun chamber. Differential pumping sections may be understood as vacuum regions that can be separately pumped by a respective vacuum pump and are separated by a respective gas separation wall for improving the vacuum conditions in the most upstream vacuum region. A differential pumping aperture, i.e. a small opening for the charged particle beam, may be provided in the gas separation wall, such that the charged particle beam can propagate from an upstream differential pumping section into a downstream differential pumping section along the optical axis. "Downstream" as used herein may be understood as downstream in the propagation direction of the charged particle beam along the optical axis A.

However, gas separation walls within the charged particle beam apparatus and respective differential pumping apertures typically increase the complexity and reduce the compactness of the charged particle beam apparatus. The contradicting requirements for good vacuum conditions on the one hand and for compactness provided by the beam-optical components on the other hand are difficult to fulfil.

Embodiments described herein provide a compact charged particle beam apparatus that also provides excellent vacuum conditions in the area of the charged particle beam emitter 105 and, hence, a good beam stability. As is depicted in FIG. 1, the gun housing 101 of the charged particle beam apparatus is divided in at least three vacuum regions that are separated by respective gas separation walls, such that at least three differential pumping sections are provided in the gun housing.

A first vacuum region 121 (the most upstream vacuum region) houses the charged particle beam emitter 105 that is configured for emitting the charged particle beam 102 that is to be directed along an optical axis A. A second vacuum region 122 is arranged downstream of the first vacuum region 121 in the direction of the optical axis A and is separated from the first vacuum region 121 by a first gas separation wall 132. A first differential pumping aperture 131 is provided in the first gas separation wall 132, such that the charged particle beam 102 can propagate from the first vacuum region 121 into the second vacuum region 122 along the optical axis A. A third vacuum region 123 is arranged downstream of the second vacuum region 122 in the direction of the optical axis A and is separated from the second vacuum region 122 by a second gas separation wall 134. A second differential pumping aperture 133 is provided in the second gas separation wall 134, such that the charged particle beam can propagate from the second vacuum region 122 into the third vacuum region 123 along the optical axis A through the second differential pumping aperture 133.

Each vacuum region may have a respective vacuum flange, such that each vacuum region can be separately pumped by at least one respective vacuum pump. This enables a stepwise improvement of the vacuum conditions from the third vacuum region 123 that is arranged closer to the specimen chamber with a higher background pressure to the first vacuum region 121 that houses the charged particle gun. For example, the first vacuum region 121 may have a first vacuum flange 126 for attaching a first vacuum pump, the second vacuum region 122 may have a second vacuum flange 127 for attaching a second vacuum pump, and the third vacuum region 123 may have a third vacuum flange 128 for attaching a third vacuum pump.

According to embodiments described herein, both the first differential pumping aperture 131 and the second differential pumping aperture 133 are beam-optical apertures, i.e. both the first and the second differential pumping apertures influence the shape and/or dimension of the charged particle beam 102. In other words, the first and the second differential pumping apertures are not only meant for improving the vacuum conditions in the first vacuum region where the charged particle beam emitter is arranged, but the first and second differential pumping apertures are also part of the beam-optical system that influences the charged particle beam. The first and second differential pumping apertures can therefore also be referred to as "beam-optical pressure stage apertures" or "beam-defining pressure stage apertures". Specifically, the first differential pumping aperture 131 is configured as a first beam limiting aperture for the charged particle beam, and the second differential pumping aperture 133 is configured as a second beam limiting aperture for the charged particle beam.

A "beam limiting aperture" can be understood as a beam-optical aperture that influences the beam dimensions by blocking an outer part of the charged particle beam during the operation of the apparatus. In particular, a "beam limiting aperture" may limit the beam size as appropriate, providing a charged particle beam with a predetermined current and/or dimension. A "differential pumping aperture" or "pressure stage aperture" can be understood as an aperture in a gas separation wall that facilitates differential pumping between the vacuum regions upstream and downstream of the aperture.

Typically, the pressures on two opposite sides of a differential pumping aperture differ by at least one order of magnitude during the operation of the apparatus. Accordingly, the charged particle beam emitter that is arranged in the first vacuum region can be efficiently isolated from the vacuum regions arranged downstream thereof and from the residual gases that may come from these "lower" sections of the charged particle beam apparatus, particularly from the specimen chamber where the specimen to be inspected is arranged.

Since the first differential pumping aperture 131 and the second differential pumping aperture 133 are also configured as beam-optical components in the charged particle beam apparatus and are thus "multi-purpose components", the compactness of the charged particle beam apparatus can be maintained while improving the vacuum conditions in the first vacuum region where the charged particle beam emitter is arranged through differential pumping. Specifically, the extremely high vacuum of the first vacuum region 121 can be isolated from the moderate vacuum of the specimen chamber where the specimen to be inspected is to be arranged. Notably, the first differential pumping aperture 131 and/or the second differential pumping aperture 133 can optionally additionally also be integrated in or used as an electrode in some embodiments, e.g., as an extractor electrode and/or as an anode, and may therefore not only be vacuum-components, but also beam-limiting and beam-forming components.

In some embodiments, which can be combined with other embodiments described herein, at least one lens may be arranged in the second vacuum region 122. In particular, a first condenser lens 106 may be arranged in the second vacuum region 122. The first condenser lens 106 may be configured for adjusting the beam divergence and thus to adjust the portion of the charged particle beam 102 that will propagate through the second differential pumping aperture 133 arranged downstream thereof. Accordingly, the first condenser lens 106 may be configured to adjust a beam current of the charged particle beam 102 downstream of the second differential pumping aperture 133.

Figure 2:
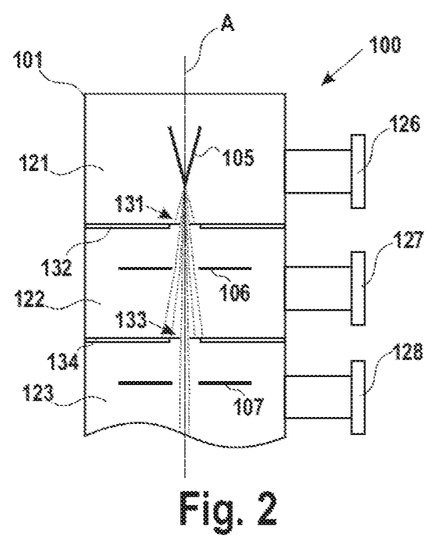
FIG. 2 shows the charged particle beam apparatus of FIG. 1 in a different state.

The beam current adjustment via the first condenser lens 106 is schematically illustrated in FIG. 1 and FIG. 2. In FIG. 1, the first condenser lens 106 is excited to provide an essentially collimated beam, and an inner part of the essentially collimated beam propagates through the second differential pumping aperture 133 that acts as a beam limiting aperture. In FIG. 2, the first condenser lens 106 is excited differently to provide a slightly divergent beam, such that an inner portion of the slightly divergent beam with the same dimension but with a reduced beam current as compared to FIG. 1 propagates through the second differential pumping aperture 133 that acts as a second beam limiting aperture. Accordingly, the beam current downstream of the second differential pumping aperture 133 can be reduced or increased by adjusting the excitation of the first condenser lens 106, i.e. through a cooperation of the first condenser lens 106 and the second differential pumping aperture 133.

In some embodiments, the first condenser lens 106 is configured to adjust the beam current downstream of the second differential pumping aperture 133 in a range between a first value of 500 pA or less and a second value of 40 nA or more, particularly between a first value of 50 pA or less and a second value of 100 nA or more.

The first condenser lens 106 may be provided with an alignment system, e.g., a mechanical alignment system, that allows a centering of the first condenser lens 106 with respect to the optical axis A. This enables an operation of the system with reduced or minimized parasitic optical aberrations.

In some embodiments, a beam alignment arrangement, e.g., a beam deflector, is arranged in the second vacuum region 122. A beam deflector changes the propagation direction of the beam. For example, a beam deflector may be provided in the second vacuum region 122 for ensuring that the propagation direction of the charged particle beam corresponds to the optical axis A of the charged particle beam apparatus and/or for ensuring that the charged particle beam coaxially impinges on the second differential pumping aperture 133. This facilitates an essentially rotationally symmetric beam profile downstream of the second differential pumping aperture. A beam alignment arrangement located within the second vacuum region 122 further facilitates the beam alignment. In some embodiments, both a lens (e.g., the first condenser lens 106) and a beam alignment arrangement (not depicted in the figures) are provided in the second vacuum region 122.

In some embodiments, a lens is arranged in the third vacuum region 123, for example a condenser lens. In particular, the first condenser lens 106 may be arranged in the second vacuum region 122 and a second condenser lens 107 may be arranged in the third vacuum region 123. The second condenser lens 107 may be configured for providing a predetermined beam divergence (e.g., a collimated beam) downstream of the second condenser lens 107. For example, an excitation of the second condenser lens 107 can be set depending on an excitation of the first condenser lens 106, such that a predetermined beam divergence can be provided downstream of the second condenser lens 107 for different beam currents. The first and second condenser lenses (and optional further condenser lenses in the second and/or third vacuum region) may constitute a condenser lens arrangement of the charged particle beam apparatus.

In some embodiments, a beam alignment arrangement, e.g., a beam deflector, is located in the third vacuum region 123. For example, a beam deflector may be provided in the third vacuum region 123 for ensuring that the propagation direction of the charged particle beam corresponds to the optical axis A of the charged particle beam apparatus and/or for ensuring that the charged particle beam coaxially enters a column housing and/or an objective lens. A beam alignment arrangement located within the third vacuum region 123 further facilitates the beam alignment. In some embodiments, both a lens (e.g., the second condenser lens 107) and a beam alignment arrangement (not depicted in the figures) are provided in the third vacuum region 123.

The second condenser lens 107 may be provided with an alignment system, e.g., a mechanical alignment system, that allows a centering of the second condenser lens 107 with respect to the optical axis A. This enables an operation of the system with reduced or minimized parasitic optical aberrations.

The first differential pumping aperture 131 that acts as the first beam limiting aperture may define the shape and/or size of the charged particle beam that enters the second vacuum region 122. Specifically, the charged particles emitted by the charged particle beam emitter 105 may be accelerated toward the first differential pumping aperture 131, e.g., by an extractor electrode or by an electrode section of the first gas separation wall 132 that is set on an extraction potential, and the charged particle beam 102 in the second vacuum region is formed by the charged particles that propagate through the first differential pumping aperture 131. Accordingly, the beam current of the charged particle beam 102 downstream of the first differential pumping aperture 131 is defined by the opening size of the first differential pumping aperture 131. Charged particles emitted by the charged particle beam emitter 105 at a large angle relative to the optical axis A are blocked by the first gas separation wall 132 that surrounds the opening of the first beam limiting aperture, and charged particles emitted at a small angle relative to the optical axis A pass through the first beam limiting aperture to form the charged particle beam 102 in the second vacuum region.

In some embodiments, the first differential pumping aperture 131 may be sized to form a charged particle beam 102 with a beam current of 20 nA or more and 200 nA or less, e.g. about 50 nA. The fine-tuning of the beam current that enters the column of the charged particle beam apparatus may be done with the first condenser lens 106 in cooperation with the second differential pumping aperture 133, as explained above. For example, the first differential pumping aperture 131 may be sized to always form a charged particle beam 102 with a predetermined beam current, and the second differential pumping aperture 133 arranged downstream thereof can adjust the beam current of the charged particle beam 102 to be focused on the specimen depending on the actual application mode of the charged particle beam apparatus. For example, a higher beam current may be provided for high-throughput applications, and a lower beam current may be provided for high-resolution application.

In particular, the first differential pumping aperture 131 may have an opening size smaller than the size corresponding to the maximum beam emission angle of the charged particle beam emitter, such that an outer portion of the charged particle beam 102 is blocked by the first differential pumping aperture 131 and a charged particle beam 102 with a predetermined dimension and shape is formed by the first differential pumping aperture 131. For example, the opening size of the first differential pumping aperture 131 may correspond to an emission angle (a) of 5° or less, and/or the maximum emission angle of the charged particle beam emitter 105 may be 10° or more.

In some embodiments, which can be combined with other embodiments described herein, the first differential pumping aperture 131 has an opening diameter of 10 μm or more and 250 μm or less, particularly a diameter of 10 μm or more and 100 μm or less. The first differential pumping aperture 131 may have a round or circular beam opening suitable for forming a round beam profile. In some embodiments, a distance D1 between the charged particle beam emitter 105 and the first differential pumping aperture 131 may be 10 mm or less, particularly 2 mm or less, more particularly 1 mm or less. A first differential pumping aperture 131 having such a shape and distance from the charged particle beam emitter 105 is suitable for forming a charged particle beam with a good beam profile and beam shape and beam current suitable for various applications.

It is to be noted that differential pumping apertures that facilitate differential pumping are typically not a part of the beam-optical system and have, therefore, conventionally much larger diameters of, e.g. 1 mm or more, in order to avoid an interaction with the charged particle beam, which is different from embodiments described herein.

In some embodiments, which can be combined with other embodiments described herein, the second differential pumping aperture 133 has an opening diameter of 5 μm or more and 250 μm or less, particularly a diameter of 10 μm or more and 100 μm or less. The second differential pumping aperture 133 may have a circular or round beam opening suitable for forming a beam with a round beam profile. A second differential pumping aperture 133 with such an opening is suitable for adjusting the beam current as appropriate in cooperation with the first condenser lens 106 while maintaining a predetermined beam profile. In some embodiments, a second distance D2 between the first differential pumping aperture 131 and the second differential pumping aperture 133 along the optical axis A may be 3 cm or more and 10 cm or less, particularly about 5 cm. An extension of the second vacuum region 122 between two pressure stage apertures having the above dimension is suitable for efficiently facilitating differential pumping. For example, a second pressure in the second vacuum region may be at least one order of magnitude lower than a third pressure in the third vacuum region, and a first pressure in the first vacuum region may be at least one order of magnitude lower than a second pressure in the second vacuum region.

In some embodiments, which can be combined with other embodiments described herein, the charged particle beam emitter 105 may be a cold field emitter (CFE) configured to emit an electron beam by cold field emission. A cold field emitter is particularly sensitive to contamination in the gun housing, such that an ultra-high vacuum is particularly beneficial for charged particle beam emitters being cold field emitters. The cold field emitter may have a tungsten tip.

In other embodiments, the charged particle beam emitter 105 may be another type of electron emitter, e.g., a thermal field emitter (TFE) of a Schottky-type emitter. In some embodiments, the charged particle beam emitter may include an ion source.

Schottky or TFE emitters are currently available with a measured reduced-brightness of up to $2\times10^8$ $Am^{-2}(SR)^{-1}V^{-1}$, CFE emitters have a measured reduced-brightness of up to $5\times10^9$ $Am^{-2}(SR)^{-1}V^{-1}$. A charged particle beam which has at least $5\times10^7$ $Am^{-2}(SR)^{-1}V^{-1}$ may be beneficial. According to embodiments of the present disclosure, a high brightness emitter may be provided. Accordingly, a beneficial current can be provided for each beamlet on the specimen such that a signal to noise ratio is provided for each beamlet that allows for high throughput. For example, according to some embodiments, which can be combined with other embodiments described herein, the emitter can have a brightness from $1\times10^8$ $Am^{-2}(SR)^{-1}V^{-1}$ to $5\times10^8$ $Am^{-2}(SR)^{-1}V^{-1}$, or even higher brightness as described above.

In some implementations, the first gas separation wall 132 may include an electrode section 141 configured to be set on an extraction potential, and the first differential pumping aperture 131 may be provided in the electrode section of the first gas separation wall. Accordingly, the first differential pumping aperture 131 can at the same time be used as an extraction electrode and/or as an anode that may be set on a potential opposite to the potential of the charged particle beam emitter 105, e.g., on a positive potential for electron extraction.

In some embodiments, a vacuum valve (not illustrated in FIG. 1) is arranged at a downstream end of the third vacuum region 123, such that the gun housing 101 that includes the first vacuum region, the second vacuum region, and the third vacuum region can be isolated from a remaining inner space of the charged particle beam apparatus 100. Accordingly, the ultra-high vacuum within the gun housing 101 can be maintained during a maintenance or service of other parts of the charged particle beam apparatus, such as the specimen chamber or the objective lens, e.g. under atmospheric pressure.

Figure 3:
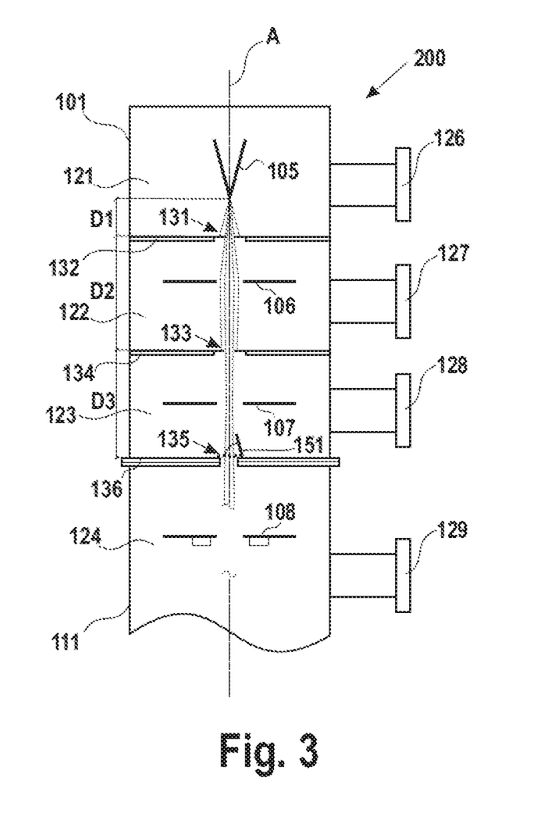
FIG. 3 is a schematic sectional view of a charged particle beam apparatus according to embodiments described herein.

FIG. 3 is a schematic sectional view of a charged particle beam apparatus 200 according to embodiments described herein. The charged particle beam apparatus 200 may include some features or all the features of the charged particle beam apparatus 100 shown in FIG. 1 and FIG. 2, such that reference can be made to the above explanations, which are not repeated here.

The charged particle beam apparatus 200 includes a gun housing 101 with three vacuum regions, namely the first vacuum region 121 that houses the charged particle beam emitter 105, the second vacuum region 122 downstream of the first vacuum region 121, and the third vacuum region 123 downstream of the second vacuum region 122. The vacuum regions are configured as differential pumping sections separated by respective gas separations walls, wherein a pressure stage aperture for the charged particle beam is provided in each gas separation wall. Accordingly, the charged particle beam can propagate from the charged particle beam emitter 105 along the optical axis A through the first, second, and third vacuum regions while maintaining good vacuum conditions in the first vacuum region.

As is schematically depicted in FIG. 3, a fourth vacuum region 124 may be provided downstream of the third vacuum region 123 in the direction along the optical axis A. The fourth vacuum region 124 may be separated from the third vacuum region 123 by a third gas separation wall 136, and a third differential pumping aperture 135 for the charged particle beam 102 may be provided in the third gas separation wall 136.

The fourth vacuum region 124 may house one or more optical components (schematically indicated by reference numeral 108 in FIG. 3), for example, at least one or more of the group consisting of: an aberration corrector, an objective lens for focusing the charged particle beam on a specimen, a scan deflector, a beam separator for separating signal charged particles from the charged particle beam, and one or more charged particle detectors. The fourth vacuum region 124 may constitute the main vacuum region of the charged particle beam apparatus that houses most of the beam-optical components, and the vacuum enclosure enclosing the fourth vacuum region 124 may therefore also be referred to as a column housing 111 of the charged particle beam apparatus.

In some embodiments, the gun housing 101 is detachably attached at the column housing. Some embodiments described herein also relate to the gun housing 101 as such, without being connected to the column housing 111.

The third gas separation wall 136 that separates the third vacuum region 123 from the fourth vacuum region 124 can further improve the vacuum conditions in the first vacuum region 121 with respect to the specimen chamber where the specimen to be inspected is arranged and can enable an efficient vacuum isolation of the first vacuum region 121 with respect to the fourth vacuum region 124 in the column housing 111.

In some embodiments, the gun housing 101 (including the first vacuum region 121, the second vacuum region 122, and the third vacuum region 123) forms a "beam emitter module" that can be attached to and detached from the column housing 111 (including the fourth vacuum region 124 that houses a major part of the optical components of the column, including the objective lens). Since the gun housing 101 is provided with at least three vacuum regions enabling differential pumping, an efficient vacuum isolation of the charged particle beam emitter 105 arranged in the first vacuum region is provided.

In some embodiments, a vacuum valve 151 is arranged at a downstream end of the third vacuum region 123, particularly provided at the third gas separation wall 136 and configured for opening and/or closing the downstream end of the third vacuum region. Accordingly, the gun housing 101 can be isolated from the column housing 111, e.g., during service or maintenance of the optical components arranged in the column housing 111, such that the ultra-high vacuum in the first vacuum region can be maintained, even if the fourth vacuum region 124 (or a vacuum region downstream of the fourth vacuum region) is flooded with gas or air.

The third differential pumping aperture 135 may have an opening diameter of 300 µm or more and 2 mm or less in some embodiments. This diameter is suitable for facilitating efficient differential pumping.

In some embodiments, the third differential pumping aperture 135 is not configured as a beam-optical aperture. Specifically, the third differential pumping aperture 135 may not be a beam limiting aperture that is configured to block an outer portion of the charged particle beam. In other words, the diameter of the third differential pumping aperture 135 may be larger than the beam diameter at the position of the third differential pumping aperture 135, such that the third differential pumping aperture 135 allows essentially the whole charged particle beam to pass therethrough. In some embodiments, the beam diameter at the third differential pumping aperture 135 may be 50 µm or more and 200 µm or less, particularly 150 µm or less, and the diameter of the third differential pumping aperture 135 may be larger than the beam diameter, such as 300 µm or more.

However, embodiments described herein are not limited to a third differential pumping aperture not being part of the optical system, and, in other embodiments, also the third differential pumping aperture 135 may be an optical aperture, particularly a beam-limiting aperture. In the latter case, the third differential pumping aperture may have a smaller opening diameter, for example 250 µm or less, or even 100 µm or less.

In some embodiments, which can be combined with other embodiments described herein, each vacuum region may have a vacuum flange for attaching a vacuum pump. Specifically, the first vacuum region 121 may have a first vacuum flange 126 for attaching a first vacuum pump for directly evacuating the first vacuum region, the second vacuum region 122 may have a second vacuum flange 127 for attaching a second vacuum pump for directly evacuating the second vacuum region, the third vacuum region 123 may have a third vacuum flange 128 for attaching a third vacuum pump for directly evacuating the third vacuum region, and the fourth vacuum region 124 may have a fourth vacuum flange 129 for attaching a fourth vacuum pump for directly evacuating the fourth vacuum region.

In some embodiments, a third distance D3 between the second differential pumping aperture 133 and the third differential pumping aperture 135 along the optical axis A may be 3 cm or more and 10 cm or less, particularly about 5 cm. An extension of the third vacuum region 123 between two pressure stage apertures having the above dimension is suitable for facilitating efficient differential pumping. In particular, a third pressure in the third vacuum region may be at least one order of magnitude lower than a fourth pressure in the fourth vacuum region, a second pressure in the second vacuum region may be at least one order of magnitude lower than a third pressure in the third vacuum region, and a first pressure in the first vacuum region may be at least one order of magnitude lower than a second pressure in the second vacuum region. Optionally, a fifth pressure in a specimen chamber that houses the specimen to be inspected may be higher than the fourth pressure in the fourth vacuum chamber. Accordingly, as a consequence of the above differential pumping concept, the vacuum conditions in the first vacuum region where the charged particle beam emitter, particularly a cold field emitter, is placed, can be further improved and an extremely low pressure of, e.g. $10^{-11}$ mbar or less can be provided in the first vacuum region 121 and maintained during the operation of the apparatus.

Notably, the extension of the fourth vacuum region 124 (that may correspond to the column housing 111) along the optical axis A is typically larger that the extension of the first to third vacuum regions, particularly 10 cm or more, or even 30 cm or more. The fourth vacuum region 124 is not fully illustrated in the attached figures.

Figure 4:
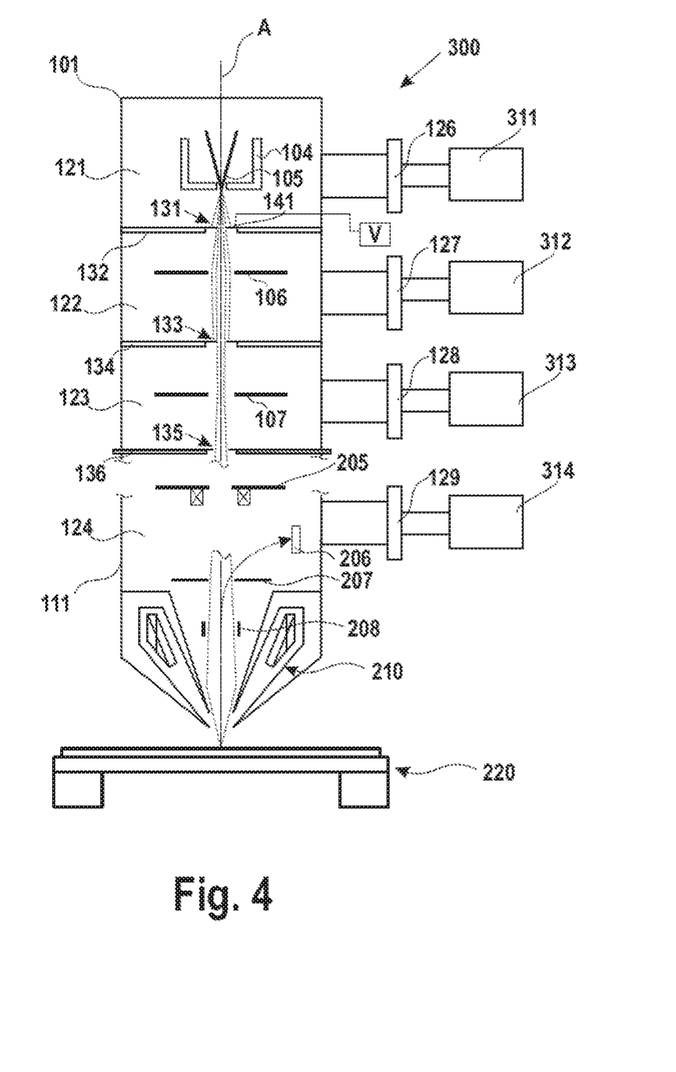
FIG. 4 is a schematic sectional view of a scanning electron microscope according to embodiments described herein.

FIG. 4 is a schematic sectional view of a scanning electron microscope 300 for inspecting a specimen according to embodiments described herein. The scanning electron microscope 300 may include a charged particle beam apparatus in accordance with any of the embodiments described herein, such that reference can be made to the above explanations, which are not repeated here.

The scanning electron microscope 300 includes a gun housing 101 with a first vacuum region 121 in which a cold field emitter for emitting an electron beam along an optical axis A is arranged. The gun housing further includes a second vacuum region 122 downstream of the first vacuum region 121 and a third vacuum region 123 downstream of the second vacuum region 122. The second vacuum region is separated from the first vacuum region by a first gas separation wall with a first differential pumping aperture 131, and the third vacuum region is separated from the second vacuum region by a second gas separation wall with a second differential pumping aperture 133. The electron beam can propagate from the cold field emitter through the first and second differential pumping apertures along the optical axis A into a fourth vacuum region 124.

The fourth vacuum region 124 is arranged downstream of the third vacuum region 123 and separated from the third vacuum region 123 by a third gas separation wall 136 that includes a third differential pumping aperture 135 for the electron beam to propagate therethrough. The fourth vacuum region 124 may be the interior of a column housing 111 that is provided downstream of the gun housing 101. Optionally, the gun housing 101 is detachably mounted at the column housing 111.

A lens arrangement, particularly a condenser lens arrangement, may be provided in the second vacuum region and/or in the third vacuum region. Further, a beam alignment or deflection arrangement may be provided in the second vacuum region and/or the third vacuum region.

At least one of a scan deflector 208, an objective lens 210 and a charged particle detector 206 for detecting signal particles emitted from the specimen may be arranged in the fourth vacuum region 124. The objective lens 210 may be configured to focus the charged particle beam on the specimen placed on a specimen stage 220. The specimen stage 220 is configured for placing the specimen to be inspected thereon and may optionally be movable, e.g., in two or three directions. Optionally, the specimen stage 220 may be placed in a fifth vacuum region, e.g. a specimen chamber, downstream of the fourth vacuum region 124.

The first vacuum region 121 can be pumped by a first vacuum pump 311 attached to a first vacuum flange 126 of the first vacuum region 121. The first vacuum pump 311 may include an ion getter pump and/or a non-evaporable getter pump. The second vacuum region 122 can be pumped by a second vacuum pump 312 attached to a second vacuum flange 127 of the second vacuum region 122. The second vacuum pump 312 may include an ion getter pump. The third vacuum region 123 can be pumped by a third vacuum pump 313 attached to a third vacuum flange 128 of the third vacuum region 123. The third vacuum pump 313 may include an ion getter pump. The fourth vacuum region 124 can be pumped by a fourth vacuum pump 314 attached to a fourth vacuum flange 129 of the fourth vacuum region 124. The fourth vacuum pump 314 may include an ion getter pump.

According to some embodiments, a suppressor electrode 104 is arranged in the first vacuum region 121 at least partially above a tip of the cold field emitter. The electrons emitted by the cold field emitter may be accelerated toward the first differential pumping aperture 131 by an extractor that may be integrated in the first gas separation wall 132. For example, the first gas separation wall 132 may include an electrode section 141 configured to be set on an extraction potential or anode potential (V), and the first differential pumping aperture 131 may be provided in the electrode section 141. An electron beam with a predetermined shape and current may be formed by the first differential pumping aperture 131 and may enter the second vacuum region 122.

The current of the electron beam downstream of the second differential pumping aperture 133 can be adjusted by a change of the excitation of a first condenser lens 106 arranged in the second vacuum region 122.

A predetermined beam divergence can be set by an optional second condenser lens 107 arranged downstream of the first condenser lens 106, e.g., in the third vacuum region 123.

The electron beam that enters the column housing 111 through the third differential pumping aperture 135 thus has a predetermined current, dimension, and divergence and is very stable due to the good vacuum conditions in the gun housing, particularly in the first vacuum region.

In some embodiments, aberrations of the electron beam are compensated in the fourth vacuum region by one or more aberration correctors 205, e.g., electrostatic or magnetic multipole arrangements.

The electron beam can be focused on the specimen by an objective lens 210, e.g., an electrostatic-magnetic objective lens.

Signal electrons, particularly secondary electrons (SE) and/or backscattered electrons (BSE), emitted by the specimen may be accelerated through the objective lens in an opposite direction and may be separated from the primary charged particle beam by a beam separator 207. The signal electrons may be detected by a charged particle detector 206, and the specimen can be imaged and/or inspected by evaluating the signal detected by the charged particle detector 206.

A compact charged particle beam apparatus with excellent vacuum conditions in the first vacuum region where the charged particle beam emitter 105 is arranged can be provided.

Figure 5:
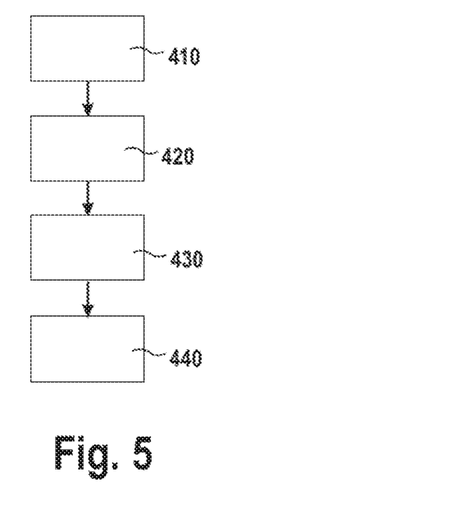
FIG. 5 is a flow chart illustrating a method of operating a charged particle beam apparatus according to embodiments described herein.

FIG. 5 shows a flow diagram of a method of operating a charged particle beam apparatus according to embodiments described herein, particularly a method of operating an electron microscope or an electron beam inspection apparatus.

The charged particle beam apparatus includes a gun housing with a first vacuum region, a second vacuum region arranged downstream of the first vacuum region along the optical axis, and a third vacuum region arranged downstream of the second vacuum region along the optical axis, that can be differentially pumped. The first vacuum region and the second vacuum region are separated by a first gas separation wall having a first differential pumping aperture provided therein, and the second vacuum region and the third vacuum region are separated by a second gas separation wall having a second differential pumping aperture provided therein.

In box 410, the first vacuum region, the second vacuum region, and the third vacuum region are evacuated. Each vacuum region may have at least one vacuum pump associated thereto for reliably evacuating the respective vacuum region.

In box 420, a charged particle beam is generated in the first vacuum region, particularly by a cold field emitter that is arranged in the first vacuum region. The charged particle beam is guided through the first differential pumping aperture in the first gas separation wall, wherein an outer portion of the charged particle beam is blocked by the first differential pumping aperture such as to form a charged particle beam with a predetermined size and/or current. Accordingly, the first differential pumping aperture is an optical aperture that limits the size of the charged particle beam.

In box 430, the charged particle beam is guided through the second differential pumping aperture in the second gas separation wall, wherein an outer portion of the charged particle beam is blocked by the second differential pumping aperture such as to adjust the size and/or current of the charged particle beam. Accordingly, also the second differential pumping aperture is an optical aperture that limits the size of the charged particle beam.

The charged particle beam apparatus may optionally include a fourth vacuum region downstream of the third vacuum region along the optical axis and separated by the third vacuum region by a third differential pumping aperture.

In box 440, the charged particle beam is guided from the third vacuum region into the fourth vacuum region through the third differential pumping aperture. In some embodiments, the third differential pumping aperture is not an optical aperture, i.e., the charged particle beam is guided through the third differential pumping aperture essentially without blocking of a portion of the charged particle beam, particularly with an essentially unmodified beam profile and beam current. For example, the third differential pumping aperture has a diameter of 300 µm or more, and a beam diameter of the charged particle beam at the third differential pumping aperture may be 150 µm or less. Accordingly, the third differential pressure aperture does not affect or otherwise modify the charged particle beam. However, embodiments described herein are not limited thereto, and other embodiments may have a third differential pumping aperture that is a beam limiting aperture as well.

In some embodiments, a beam current of the charged particle beam downstream of the second differential pumping aperture is adjusted by adjusting a focusing strength of a first condenser lens that may be arranged in the second vacuum region. Optionally, a beam divergence may be set as appropriate by a second condenser lens arranged downstream of the first condenser lens, e.g., in the third vacuum region.

The method may further comprise focusing the charged particle beam on a specimen by an objective lens that may be arranged in the fourth vacuum region. Signal charged particles emitted from the specimen may be detected by a charged particle detector that may be arranged in the fourth vacuum region.

The differential pumping concept described herein allows following pressure conditions to be obtained during the operation of the charged particle beam apparatus: In some embodiments, the first vacuum region is evacuated to a pressure of $10^{-11}$ mbar or less, the second vacuum region is evacuated to a pressure of $10^{-9}$ mbar or less, the third vacuum region is evacuated to a pressure of $10^{-8}$ mbar or less, and/or the fourth vacuum region is evacuated to a pressure of $10^{-5}$ mbar or less.

It is to be understood that each of the claims that follow herebelow may refer back to one or more precedent claims, and such embodiments that include the features of an arbitrary subset of the claims are encompassed by the present disclosure. While the foregoing is directed to embodiments, other and further embodiments may be devised without departing from the basic scope, and the scope thereof is determined by the claims that follow.

The invention claimed is:

1. A charged particle beam apparatus, comprising:
   a first vacuum region in which a charged particle beam emitter for emitting a charged particle beam along an optical axis (A) is arranged;
   a second vacuum region downstream of the first vacuum region and separated from the first vacuum region by a first gas separation wall with a first differential pumping aperture, wherein the first differential pumping aperture is configured as a first beam limiting aperture for the charged particle beam; and
   a third vacuum region downstream of the second vacuum region and separated from the second vacuum region by a second gas separation wall with a second differential pumping aperture, wherein the second differential pumping aperture is configured as a second beam limiting aperture for the charged particle beam.

2. The charged particle beam apparatus according to claim 1, wherein a first condenser lens is arranged in the second vacuum region, the first condenser lens is configured to adjust a beam current of the charged particle beam downstream of the second differential pumping aperture.

3. The charged particle beam apparatus according to claim 1, wherein a second condenser lens is arranged in the third vacuum region.

4. The charged particle beam apparatus according to claim 1, wherein at least one of the first differential pumping aperture and the second differential pumping aperture has an opening diameter of 5 µm or more and 250 µm or less.

5. The charged particle beam apparatus according to claim 1, wherein
   a first distance between the charged particle beam emitter and the first differential pumping aperture is 1 cm or less; and
   a second distance between the first differential pumping aperture and the second differential pumping aperture is 3 cm or more and 10 cm or less.

6. The charged particle beam apparatus according to claim 1, comprising a gun housing that contains at least the first vacuum region, the second vacuum region, and the third vacuum region, wherein the gun housing is attachable or attached to a column housing that contains at least a fourth vacuum region.

7. The charged particle beam apparatus according to claim 1, further comprising a fourth vacuum region downstream of the third vacuum region and separated from the third vacuum region by a third gas separation wall with a third differential pumping aperture for the charged particle beam.

8. The charged particle beam apparatus according to claim 7, wherein the third differential pumping aperture is not a beam limiting aperture.

9. The charged particle beam apparatus according to claim 7, wherein the fourth vacuum region houses one or more of the group consisting of: an aberration corrector, an objective lens for focusing the charged particle beam on a specimen, a scan deflector, a beam separator for separating signal charged particles from the charged particle beam, and a charged particle detector.

10. The charged particle beam apparatus according to claim 1, wherein the first vacuum region, the second vacuum region, and the third vacuum region region each have a vacuum flange and a respective vacuum pump connected to the vacuum flange.

11. The charged particle beam apparatus according to claim 1, wherein the charged particle beam emitter is a cold field emitter for emitting an electron beam.

12. The charged particle beam apparatus according to claim 1, wherein the first gas separation wall comprises an electrode section configured to be set on an extraction potential, and the first differential pumping aperture is provided in the electrode section.

13. The charged particle beam apparatus according to claim 1, wherein a beam alignment arrangement is provided in at least one of the second vacuum region and the third vacuum region.

14. A scanning electron microscope for inspecting a specimen, comprising:
   a first vacuum region in which a cold field emitter for emitting an electron beam along an optical axis (A) is arranged;
   a second vacuum region downstream of the first vacuum region and separated from the first vacuum region by a first gas separation wall with a first differential pumping aperture, wherein the first differential pumping aperture is configured as a first beam limiting aperture for the electron beam;
   a third vacuum region downstream of the second vacuum region and separated from the second vacuum region by a second gas separation wall with a second differential pumping aperture, wherein the second differential pumping aperture is configured as a second beam limiting aperture for the electron beam;
   a lens arrangement arranged in at least one of the second vacuum region and the third vacuum region;
   a fourth vacuum region downstream of the third vacuum region and separated from the third vacuum region by a third gas separation wall with a third differential pumping aperture for the electron beam; and
   at least one of a scan deflector, an objective lens and a charged particle detector arranged in the fourth vacuum region.

15. A method of operating a charged particle beam apparatus, comprising:
   evacuating a first vacuum region, a second vacuum region downstream of the first vacuum region and separated from the first vacuum region by a first gas separation wall with a first differential pumping aperture, and a third vacuum region downstream of the second vacuum region and separated from the second vacuum region by a second gas separation wall with a second differential pumping aperture;
   generating a charged particle beam in the first vacuum region;

directing the charged particle beam through the first differential pumping aperture in the first gas separation wall, such that an outer portion of the charged particle beam is blocked; and directing the charged particle beam through the second differential pumping aperture in the second gas separation wall, such that an outer portion of the charged particle beam is blocked.

16. The method of claim 15, further comprising adjusting a beam current of the charged particle beam downstream of the second differential pumping aperture by adjusting a focusing strength of a first condenser lens arranged in the second vacuum region.

17. The method of claim 15, further comprising evacuating a fourth vacuum region downstream of the third vacuum region and separated from the third vacuum region by a third gas separation wall with a third differential pumping aperture, and directing the charged particle beam into the fourth vacuum region through the third differential pumping aperture.

18. The method of claim 17, wherein the third differential pumping aperture has a diameter of 300 μm or more, and a beam diameter of the charged particle beam at the third differential pumping aperture is 150 μm or less.

19. The method of claim 17, wherein the charged particle beam is focused by an objective lens arranged in the fourth vacuum region, and signal charged particles emitted from a specimen are detected by a charged particle detector arranged in the fourth vacuum region.

20. The method of claim 15, wherein one or more of the following applies:

the first vacuum region is evacuated to a maximum pressure of $10^{-11}$ mbar, the second vacuum region is evacuated to a maximum pressure of $10^{-9}$ mbar, and the third vacuum region is evacuated to a maximum pressure $10^{-8}$ mbar.

* * * * *